United States Patent
Terano et al.

(10) Patent No.: US 6,670,600 B2
(45) Date of Patent: Dec. 30, 2003

(54) SEMICONDUCTOR PHOTODETECTOR WITH OHMIC CONTACT AREAS FORMED TO PREVENT INCIDENT LIGHT FROM RESOLVING THE AREAS, SEMICONDUCTOR PHOTO RECEIVER AND SEMICONDUCTOR DEVICE INSTALLED WITH THE SEMICONDUCTOR PHOTODETECTOR

(75) Inventors: Akihisa Terano, Hachioji (JP); Yasunobu Matsuoka, Hachioji (JP); Shigehisa Tanaka, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 67 days.

(21) Appl. No.: 09/905,956

(22) Filed: Jul. 17, 2001

(65) Prior Publication Data

US 2002/0135036 A1 Sep. 26, 2002

(30) Foreign Application Priority Data

Mar. 23, 2001 (JP) ........................................ 2001-084307

(51) Int. Cl.[7] .............................................. H01L 31/00
(52) U.S. Cl. ..................................... 250/214.1; 257/436
(58) Field of Search ........................ 250/214.1, 214 R; 257/436, 437, 446, 447; 136/255, 256

(56) References Cited

U.S. PATENT DOCUMENTS

| | | | | |
|---|---|---|---|---|
| 4,886,555 A | * | 12/1989 | Hackstein et al. | 136/255 |
| 5,149,963 A | * | 9/1992 | Hassler, Jr. | 250/227.21 |
| 5,164,809 A | * | 11/1992 | Street et al. | 257/55 |

\* cited by examiner

*Primary Examiner*—Thanh X. Luu

(57) ABSTRACT

An ultrahigh speed, high sensitivity photodetector, optical module and/or optical transmission device made by reducing the size of a surface illuminated type photodetector to decrease capacitance C. The effective detecting area on a side of the substrate that is opposite to a light incidence side of the substrate in a surface illuminated type photodetector and that is reached by the incident light passing through the semiconductor includes a plurality of ohmic contact areas and a reflector. The reflector may be a laminate comprised of two films in contact with the semiconductor including a transparent film (lower) and a metal film (upper). The size of the ohmic contacts may be small when compared to the wavelength of light incident on the surface of the photodetector. The photodetector may be used in ultrahigh speed, high sensitivity optical modules, semiconductor photo receivers and optical transmission devices with increased transmission capacities.

20 Claims, 6 Drawing Sheets

SEMICONDUCTOR PHOTODETECTOR WITH OHMIC CONTACT AREAS FORMED TO PREVENT INCIDENT LIGHT FROM RESOLVING THE AREAS, SEMICONDUCTOR PHOTO RECEIVER AND SEMICONDUCTOR DEVICE INSTALLED WITH THE SEMICONDUCTOR PHOTODETECTOR

PRIORITY TO FOREIGN APPLICATIONS

This application claims priority to Japanese Patent Application No. P2001-084307.

BACKGROUND OF THE INVENTION

1. Field of the Invention

This invention relates to a semiconductor photodetector, a semiconductor photo receiver, and a semiconductor device and more particularly relates to a surface illuminated type photodetector in which incident light is cast perpendicularly onto the semiconductor substrate surface and is converted into electrical signals, and a semiconductor photo receiver and a semiconductor device which use the same for optical communications.

2. Description of the Background

In recent years, the need for transmitting large capacity data such as image data has been increasing with the rapid expansion of information services based on communications media such as the Internet. Likewise, there is a need to increase the transmission capacity for such information networks that carry this data.

To construct an optical communications system with a transmission capacity over 10 Gbps, it is necessary to develop an optical transmission device which features ultra-high speed and high sensitivity. To develop such an optical transmission device, it may be necessary to use an ultrahigh speed, high-sensitivity semiconductor photodetector capable of receiving optical signals and of converting them into electrical signals.

The response velocity of a semiconductor photodetector is determined by the CR constant (calculated as the product of capacitance C and resistance R) and the transit time of the carrier excited by incoming optical signals.

To increase the response velocity, the capacitance C and resistance R must be decreased and the transit time must be shortened. Since the transit time is proportional to the thickness of the photo absorbing layer of the semiconductor photodetector, the photo absorbing layer is preferably thinned as much as possible. However, as the photo absorbing layer becomes thinner, the amount of light that is transmitted but not absorbed by the photo absorbing layer increases, causing a deterioration in sensitivity.

As mentioned above in connection with the thickness of the photo absorbing layer, there is a trade-off between the response velocity and sensitivity, and vice versa. Therefore, it may be difficult to develop a semiconductor photodetector that provides both the desired high response velocity and sensitivity. This has caused a bottleneck in the development of an ultrahigh speed, high sensitivity optical transmission device.

As a conventional solution to the above problem, the method disclosed in JP-A-218488/1993 is known. In this method, a reflector that has a size suitable for the effective detecting area size and consists of two films lying in contact with the semiconductor layer—a dielectric film (lower) and an electrode metal film (upper)—is formed on the side of a substrate that is opposite to its light incidence side and that is reached by incident light passing through the photo absorbing layer. The light that is transmitted but not absorbed by the photo absorbing layer is efficiently reflected back to the semiconductor layer.

Figure 2A:
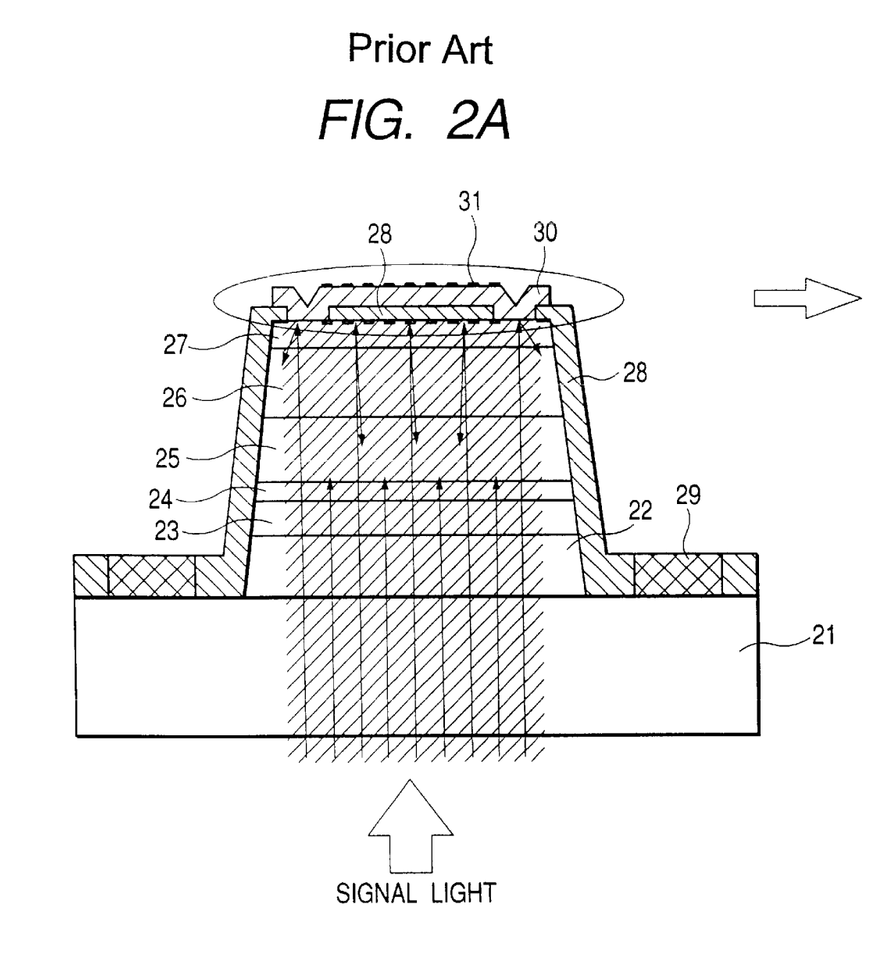
FIG. 2 is a sectional view illustrating the structure of a conventional backside illuminated type avalanche multiplication photodetector.
Figure 2B:
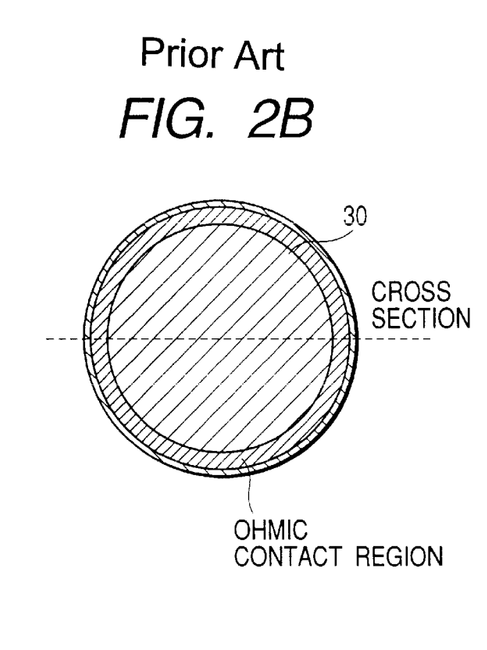

FIG. 2 is a schematic sectional view showing a backside illuminated type avalanche multiplication photodetector (APD) based on the above-mentioned art. As shown in the figure, the following layers are consecutively formed on an n-type InP substrate 21 in the following order: a high density n-type InAlAs buffer layer with 0.7 $\mu$m thickness 22; a low density n-type InAlAs multiplication layer with 0.2 $\mu$m thickness 23; an undoped InGaAs/InAlAs super lattice layer with 0.05 $\mu$m thickness 24; a low density p-type InGaAs photo absorbing layer with 1.0 $\mu$m thickness 25; a p-type InAlAs buffer layer with 1.0 $\mu$m thickness 26; and a high density p-type InGaAs contact layer with 0.1 $\mu$m thickness 27. The above composition results in a mesa structure with a diameter of the p-n junction of 50 $\mu$m.

The surface of the substrate is thereafter passivated by a SiN insulating film 28, and an n-type ohmic electrode 29 is formed in a desired area on the substrate 21. A p-type ohmic electrode 30 lies not only on the contact layer 27 but also on the SiN insulating film 28 with a 40 $\mu$m diameter formed inside the effective detecting area of the contact layer 27.

The dielectric film 28 which consists of a SiN or other similar insulating film hardly reacts with the p-type InGaAs contact layer 26 as a semiconductor layer and p-type ohmic electrode 30 even when it has been annealed at a high temperature in the manufacturing process. Therefore, the uniformity of the interface is maintained at a satisfactory level. The metal surface of the p-type ohmic electrode 30 in contact with the SiN insulating film 28, or a reflector 31 composed of the SiN insulating film 28 and p-type ohmic electrode 30, completely reflects the transmitted light back into the photo absorbing layer 25 with a reflectivity of 100%, which leads to an improvement in quantum efficiency.

As the area of the reflector 31 increases, the effective detecting area size may be larger. Hence, the photodetector's quantum efficiency depends on the area of the reflector. Also, since an ohmic contact area between the electrode metal film and the semiconductor layer may be formed in the surrounding area (other than the area of the reflector 31), a low reflectivity zone generated by the ohmic contact area does not directly affect the reflection of light to a substantial degree.

SUMMARY OF THE INVENTION

The influence of capacitance C may be a more important factor as the transmission capacities in optical communications and other applications increases. Therefore, for the development of a higher speed, sensitive optical transmission device, it is preferable to reduce the photodetector size in order to decrease the capacitance. With respect to the size of the photodetector, the ideal ratio of the minimum effective detecting area size to the diameter of the p-n junction is equal to 1.

If the ratio of the effective detecting area size to the p-n junction diameter is made as near as possible to 1 using the above-mentioned prior art, the size of the ohmic contact area formed in an area other than the reflector area must be decreased in order to obtain a sufficient effective detecting area (area of the reflector), which would result in an increase in the resistance. Conversely, if the ohmic contact area is made sufficient, the effective detecting area size (area of the reflector) should be smaller, resulting in a deterioration in sensitivity.

For example, in the case of the above-described semiconductor photodetector, the diameter of the p-n junction is 50 μm, which makes the capacitance approximately 0.1 pF, and the resulting frequency response at least 10 GHz. Assuming, for example, that this photodetector runs at 40 GHz, the limit for the capacitance is 0.05 pF because of the CR constant, which leads to a calculated result of approximately 34 μm as the optimum diameter of the p-n junction.

Consequently, if a photodetector with the same level of resistance is manufactured using this conventional technique, the effective detecting area size would be 20 μm or less. This not only would necessitate a high accuracy in the optical axis alignment with the fiber in the packaging process but also may cause an optical axis alignment error to occur due to a change in the ambient temperature during use. As a result, the quantum efficiency would likely decrease. Therefore, for a surface illuminated type photodetector manufactured using the conventional technique as explained above, it has been difficult to reduce its size to decrease its capacitance C, which has hampered the development of an ultrahigh speed, high sensitivity optical transmission device.

In at least one embodiment, the present invention preferably provides a high sensitivity, high speed surface illuminated type photodetector that does not cause an increase in the resistance and a decrease in the quantum efficiency although it is smaller than conventional type photodetectors. The present invention may also provide a semiconductor photo receiver and a semiconductor device that incorporate said photodetector.

To address one or more of the above-mentioned limitations in conventional photodetectors, a semiconductor photodetector according to the present invention comprises a surface illuminated type photodetector (a "backside illuminated photodetector") that has one or more of the following elements: a plurality of narrow-stripe or dot pattern ohmic contact areas formed in the effective detecting area on the side of the substrate that is opposite to the light incidence side and that is reached by incident light passing through the semiconductor; and a reflector consisting of a transparent film (lower film) and a metal film (upper film) lying on said semiconductor.

It may be preferable from the viewpoint of manufacturing convenience to make the above-mentioned narrow-stripe or dot patterns in the form of concentric rings, but the invention is not limited specifically thereto. Other patterns may be used within the scope of the present invention such as a distribution of independent grid, rectangular or circular patterns.

The size of the above-said narrow-stripe or dot pattern ohmic contact area is preferably determined so that incident light can not resolve the ohmic contact area on the surface. More specifically, because the optical wavelength is approximately 1.5 μm, it is desirable to make the width of each stripe or the diameter of each dot not more than approximately 2 μm so that the incident light can not resolve or detect the "holes" in the surface. In this case, the term "approximately" includes a plus/minus 5% error due to manufacturing limitations around the intended ohmic contact area size of no more than 2 μm.

According to an aspect of the present invention, the surface illuminated type photodetector preferably takes advantage of the nature of light in that it cannot recognize an object smaller than its wavelength and tends to diffuse in the direction of its advance. The above-mentioned narrow-stripe or dot pattern ohmic contact areas function as an electrode and do not function as a reflecting surface. Hence, the light reflecting surface of the surface illuminated type photodetector has an area which is virtually equal to the total of the ohmic contact areas plus the area of the laminate composed of transparent and metal films, that is an effective detecting area.

For example, if circular ohmic contact areas with a diameter of approximately 1.0 μm that are in contact with the semiconductor are distributed inside the reflector surface, the contours of the ohmic contact areas, which are low in reflectivity, are blurred. Due to the diffusion of surrounding light reflected by the reflector, the reflected light inside the effective detecting area, in which both the reflector and ohmic contact areas exist, becomes reflected light which is almost completely governed by bright areas. With virtually no influence from dark areas generated by the ohmic contact areas, the overall reflectivity and the uniformity of sensitivity in the detecting area may be maintained at an adequate level.

The above arrangement preferably ensures that while the effective reflecting area is maintained, the ohmic contact area size is also sufficient. In addition, since the entire effective detecting area is used to make a current passage between the ohmic electrode and semiconductor, a slight decrease in the total ohmic contact area size does not cause a significant increase in the resistance that may affect the photodetector operation. For this reason, the speed can be increased by decreasing the resistance between electrodes to reduce the RC constant.

At the same time, since the effective reflecting area is not affected by the ohmic contact areas, the quantum efficiency or sensitivity may be enhanced by increasing the amount of reflected light. In other words, it may be possible to make a smaller semiconductor photodetector without an increase in the CR constant. The corresponding reduction in capacitance C permits the development of a semiconductor photodetector with a high response velocity and a high sensitivity as well as a semiconductor photo receiver and a semiconductor device which incorporate the same.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

First Exemplary Embodiment

Figure 1A:
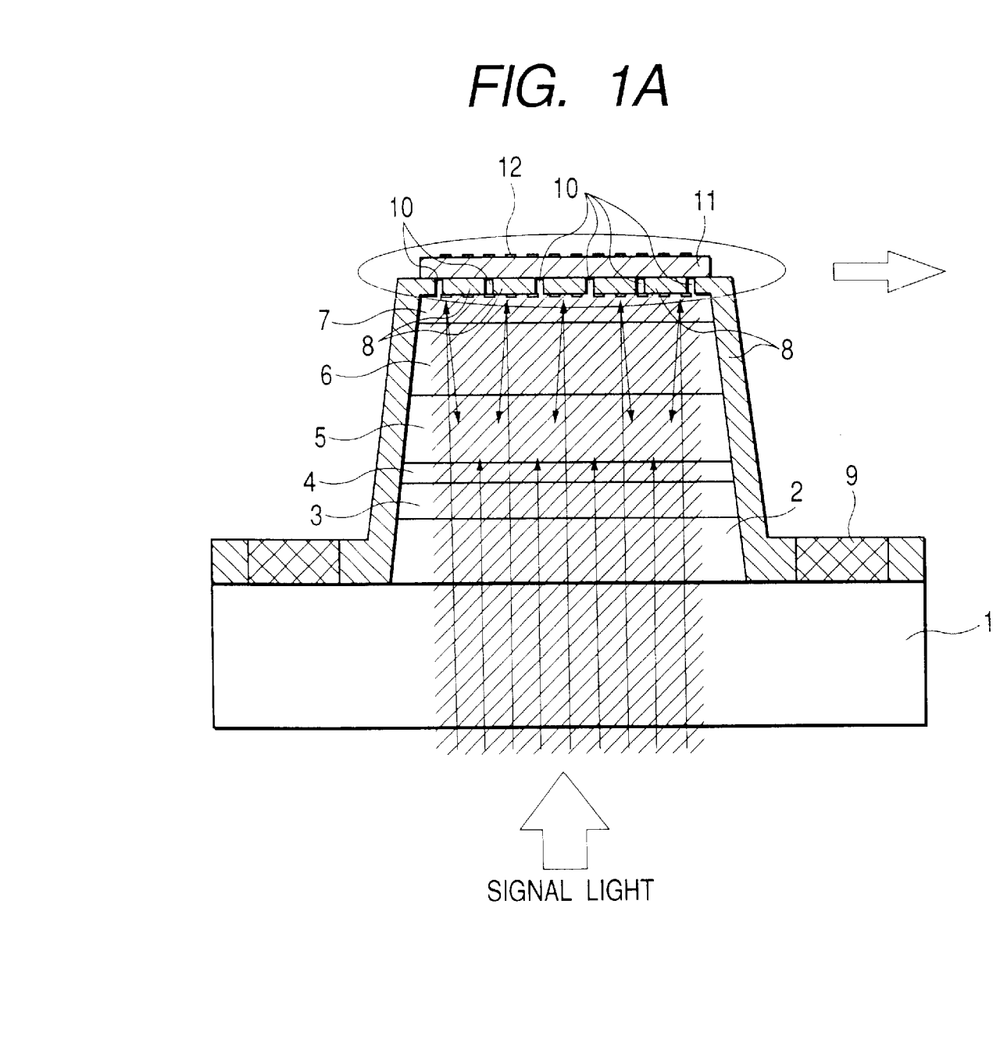
FIG. 1 is a schematic sectional view and a partial top view of a semiconductor photodetector according to the present invention.
Figure 1B:
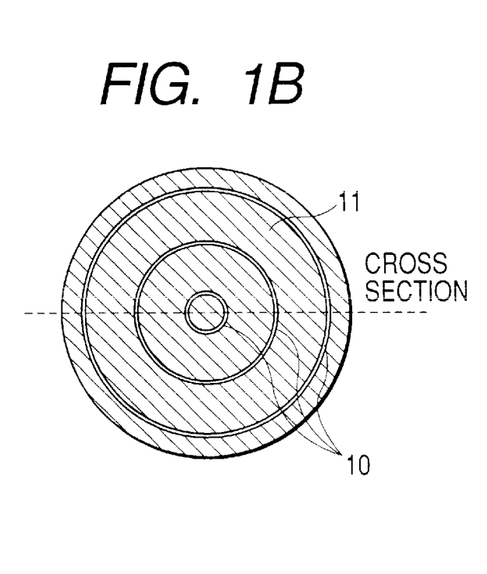

FIG. 1A and FIG. 1B show a schematic sectional view and a partial top view of a surface illuminated type photodetector according to a first exemplary embodiment of the present invention. This embodiment represents a backside illuminated type avalanche multiplication photodetector (APD) which preferably comprises the following elements: semiconductor layers 2 through 7 including a photo absorbing layer 5 which are formed on a substrate 1; a plurality of ohmic contact area rings 10 inside the photo detecting area on the side of the substrate that is opposite to the light incidence side and that is reached by incident light passing through the semiconductor layers; and a reflector 12 comprising a transparent film on the semiconductor layer 7 and a metal film 11 on the transparent film. The transparent film is a single or multilayer dielectric film made out of a part of a SiN insulating film 8 which lies on the semiconductor layer 7. The plural ohmic contact area rings 10 preferably constitute concentric circles having a line width of approximately 2 $\mu$m or less with the center of the electrode formation area as their center.

A brief description of one preferred manufacturing process according to this embodiment will now be given. Using a known molecular beam epitaxy (MBE) method, the following layers are preferably consecutively formed on an n-type InP substrate 1: a high density n-type InAlAs buffer layer with 0.7 $\mu$m thickness 2; a low density n-type InAlAs multiplication layer with 0.2 $\mu$m thickness 3; an undoped InGaAs/InAlAs super lattice layer with 0.05 $\mu$m thickness 4; a low density p-type InGaAs photo absorbing layer with 1.0 $\mu$m thickness 5; a p-type InAlAs buffer layer with 1.0 $\mu$m thickness 6; and a high density p-type InGaAs contact layer with 0.1 nm thickness 7 in a way that a mesa structure with a diameter of p-n junction of 50 $\mu$m is made up by chemical etching. The above thicknesses are all approximate and may be altered by one skilled in the art.

The surface of the substrate is preferably passivated by a SiN insulating film 8, and an n-type ohmic electrode 9 is formed in a desired area on the n-type InP substrate 1. The ohmic contact areas, which are shown as three concentric circles with a line width of approximately 1.0 $\mu$m, are made in the SiN insulating film 8 lying on the contact layer 7, and a p-type ohmic electrode 11 is provided on both the ohmic contact areas 10 and the SiN insulating film 8 lying on the contact layer 7. The ohmic contact areas 10 preferably provide an adequate ohmic characteristic which allow the contact layer 7 and the p-type ohmic electrode 11 to come into contact with each other. Also, signal light is adequately reflected by a reflector 12 (enclosed by a dotted line in the FIG.) as a laminate composed of other parts of the SiN insulating film 8 and p-type ohmic electrode 11.

An experimental semiconductor photodetector made according to the above-mentioned process embodiment has a breakdown voltage of approximately 30 V. Since multiplication occurs from 15 V, this photodetector's operating voltage range is from approximately 15 V to 30 V. It has been found that the maximum multiplication factor is 80 or higher, and the multiplication factor at an applied voltage of 27 V is approximately 10. When the high frequency characteristic of the photodetector is measured at a load resistance of 50 ohms, it has been found that the frequency is at least 17 GHz in the 3 dB bandwidth when the multiplication factor is in the range from 2 to 12.

The APD according to this preferred embodiment, which has ohmic contact areas inside a reflector with a diameter almost equal to the above p-n junction diameter, provides a quantum efficiency of approximately 91%, which is higher than the 83% quantum efficiency provided by the APD with a conventional reflector which has a p-n junction diameter of 50 $\mu$m. This increase is attributable to the fact that the effective detecting area diameter is increased from 40 $\mu$m to 50 $\mu$m. When the diameter of the p-n junction is the same, this embodiment provides a higher quantum efficiency than the conventional photodetector, which may also lead to a larger tolerance for positional errors with respect to signal light.

The capacitance of the photodetector according to this embodiment is approximately 0.1 pF; however, the present invention may be applied to smaller photodetectors to make a semiconductor photodetector which uses a conventional device and runs at 40 GHz.

Second Exemplary Embodiment

Figure 3:
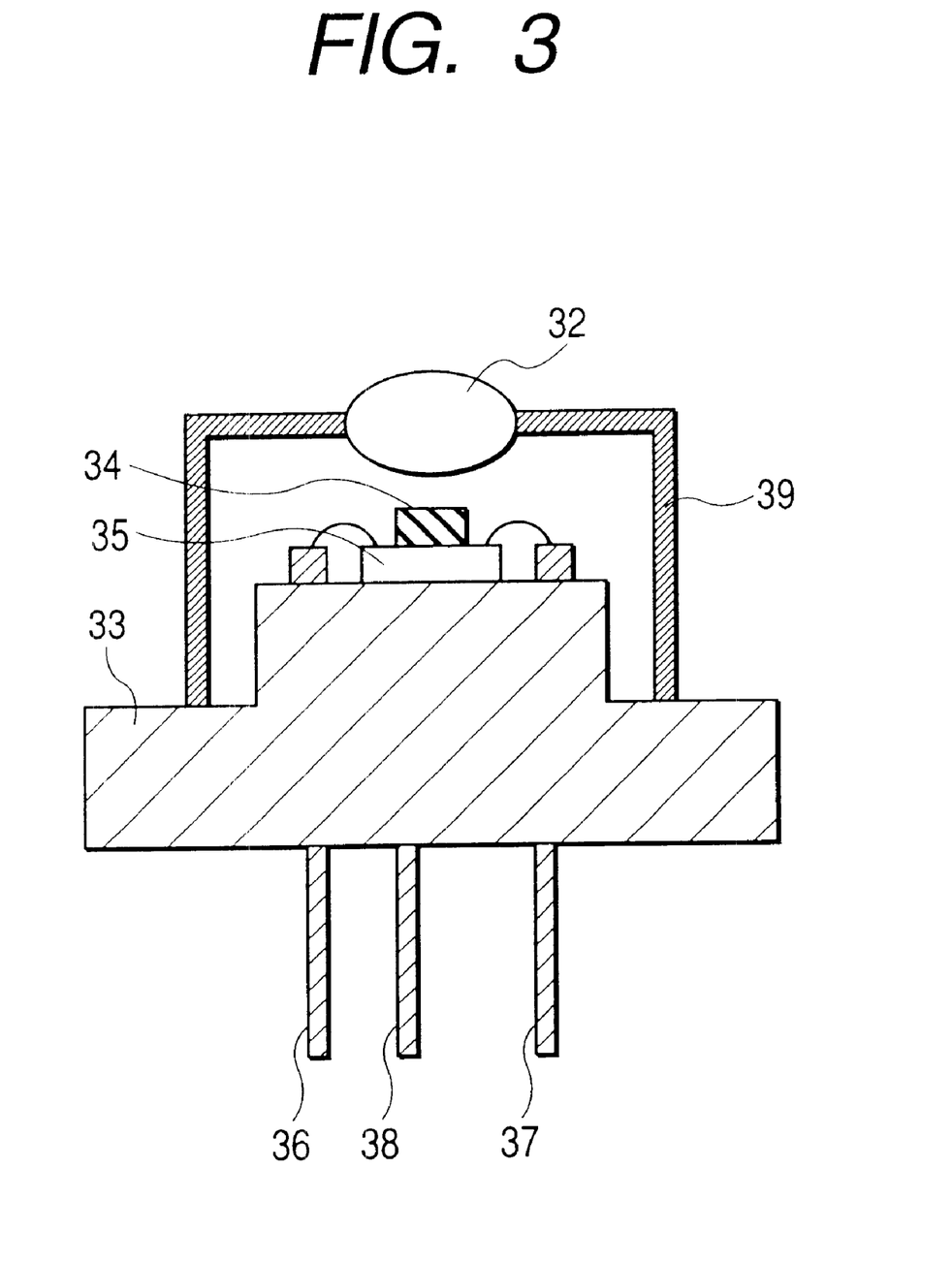
FIG. 3 is a sectional view of an optical receiver module which uses a backside illuminated type photodetector according to the present invention.

FIG. 3 is a sectional view showing an optical receiver module based on a backside illuminated type photodetector according to a preferred embodiment of the present invention.

In FIG. 3, a backside illuminated type photodetector 34 according to the present invention is flip-chip bonded on a mount 35 bearing metal wire in a desired place on a header 33, which is preferably provided with an anode pin 36, a cathode pin 37, a case pin 38, a lens holder 39 and a lens 32.

The semiconductor photodetector 34 and the metal wire on the mount 35 are preferably connected by AuSn soldering. The metal wire on the mount 35 is connected with the anode pin 36 and the cathode pin 37 by bonding with Au wires. It has been found experimentally that the positional error of the photodetector once mounted with respect to the lens is not more than approximately 1.0 $\mu$m and that, when incident light with a wavelength of 1.55 $\mu$m is made to impinge on it using an optical fiber, the quantum efficiency may be as high as 93.2%.

Third Exemplary Embodiment

Figure 4:
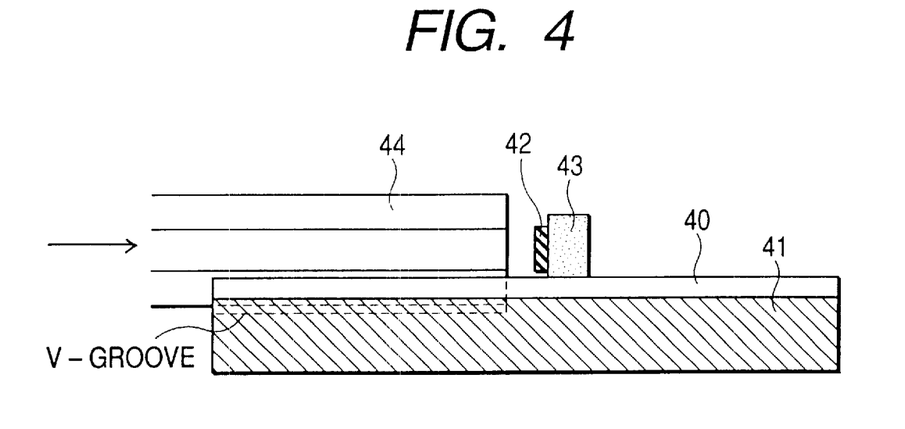
FIG. 4 is a sectional view of an optical module which uses a backside illuminated type photodetector according to the present invention.

FIG. 4 is a sectional view showing an optical module based on a backside illuminated type photodetector according to another embodiment of the present invention. In this embodiment, a carrier 43 with a metal wire on which a backside illuminated type photodetector 42 is flip-chip bonded is preferably mounted on a V-grooved optical waveguide substrate 41.

In this case, AuSn solder may be used for connection between the semiconductor photodetector 42 and the metal wire on the carrier 43 as well as between the carrier 43 and the metal wire on the V-grooved optical waveguide substrate 41. After soldering, a flat-ended optical fiber 44 is fitted into the V groove.

In this embodiment, it has been shown experimentally that when the photodetector is mounted and the optical fiber is fitted, the positional error is within +/−1.0 μm and the sensitivity to light with a wavelength of 1.55 μm is as high as 0.87 A/W. The maximum cut-off frequency is approximately at least 20 GHz, and there may be no sign of bandwidth degradation due to stray capacitance.

Fourth Exemplary Embodiment

Figure 5:
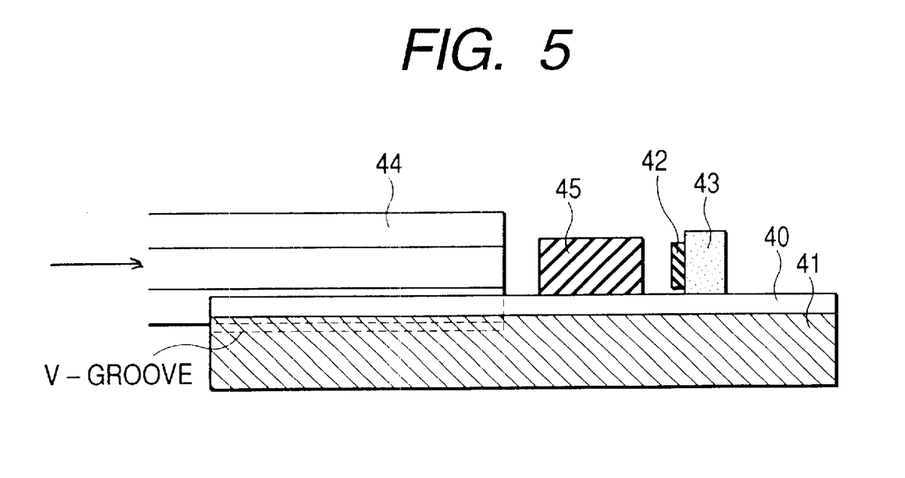
FIG. 5 is a sectional view of an optical module according to the present invention.

FIG. 5 is a sectional view showing an optical module according to a further embodiment of the present invention. This embodiment uses a backside illuminated type PIN-PD according to the present invention as a monitor. In this embodiment, a semiconductor laser 45 and a carrier 43 with metal wire on which a backside illuminated type PIN-PD 42 is flip-chip bonded are mounted on a V-grooved optical waveguide substrate 41 bearing an insulating film 40, metal wire for the monitor photodetector and metal wire for the semiconductor laser.

In this case, AuSn solder may be used for connection between the backside illuminated type PIN-PD 42 and the metal wire on the carrier 43, between the carrier 43 and the metal wire for the monitor photodetector on the V-grooved optical waveguide substrate 41, and between the semiconductor laser 45 and the metal wire for the semiconductor laser. After soldering, a flat-ended optical fiber 44 is fitted into the V groove.

In this embodiment, experiments show that when the various devices are mounted and the optical fiber is fitted, the positional error is within +/−1.0 μm and the optical coupling loss between the semiconductor laser 45 and PIN-PD 46 for the monitor is between 1 dB and 2 dB. The monitor current with 1 mW external output is shown to be at a favorable level of approximately 600 μA.

Fifth Exemplary Embodiment

Figure 6:
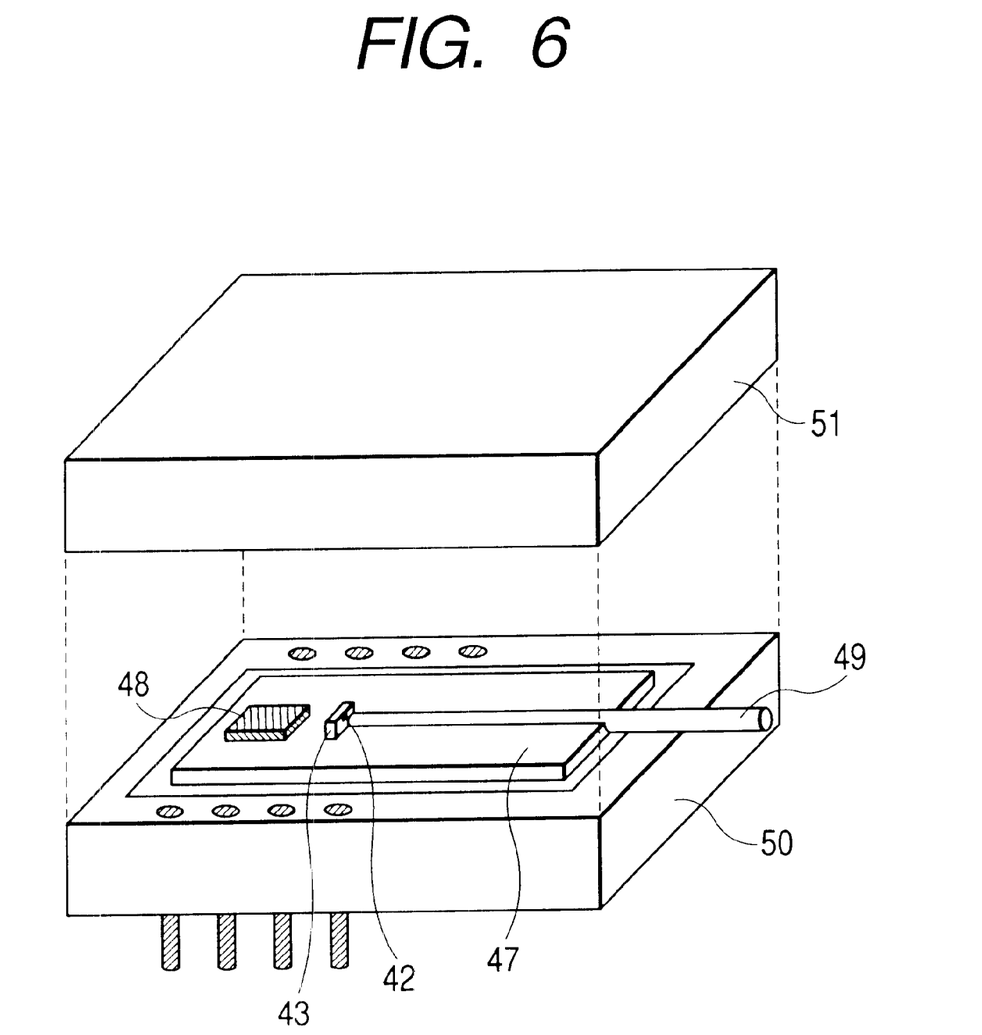
FIG. 6 is a perspective view of a packaged optical receiver module which uses a backside illuminated type photodetector according to the present invention.

FIG. 6 is a perspective view showing an optical receiver module packaged with a backside illuminated type photodetector as an embodiment of the present invention.

In this embodiment, a carrier 43 with metal wire on which a backside illuminated type photodetector 42 according to the present invention is flip-chip bonded and a receiver preamplifier IC 48 for higher sensitivity are mounted on a V-grooved substrate 47. Furthermore, an optical fiber 49 for incidence of signal light is fixed on a ceramic base 50, which is covered with a cover 51.

An evaluation of the transmission property of the module thus prepared shows a satisfactory result in that the sensitivity at an error rate of $10^{-12}$ is 7 dB when the signal light wavelength is 1.5 μm and the signal speed 10 Gb/s.

A resin base and a resin cover or a transfer-molded resin base and a transfer-molded resin cover may be used instead of the ceramic base 50 and cover 51. The packaging may also be made from a material such as a plastic, metal, or subcombination of any of the above materials. Additionally, instead of the V-grooved substrate 47, an optical waveguide substrate which has an optical circuit may be used. It is also acceptable to package an optical transmitter module and an optical transmitter/receiver module which use a backside illuminated type photodetector according to the present invention.

Sixth Exemplary Embodiment

Figure 7:
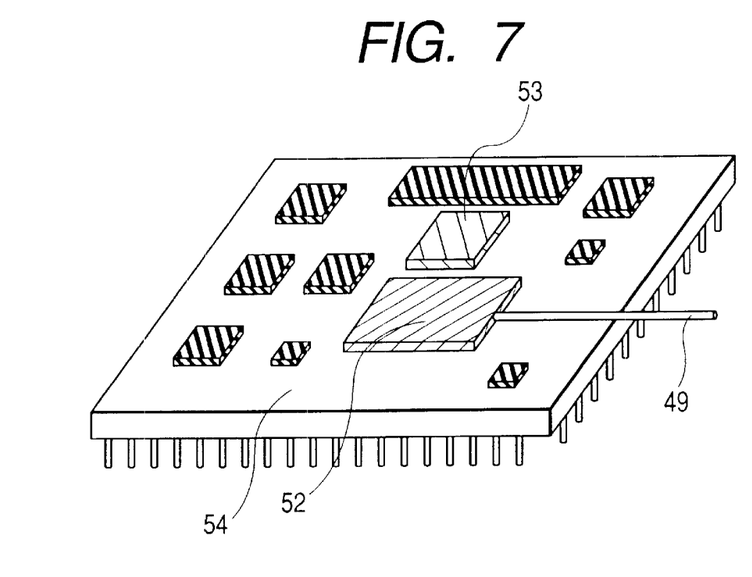
FIG. 7 is a perspective view of an optical communications device which uses a backside illuminated type photodetector according to the present invention.

FIG. 7 is a perspective view showing an optical communications device based on a backside illuminated type photodetector as an embodiment of the present invention.

In this embodiment, an optical receiver module 52 with an optical fiber 49 for incidence of signal light bearing a backside illuminated type photodetector according to the present invention is mounted on a board 54 together with a receiver IC 53 and other electronic components.

Figure 8:
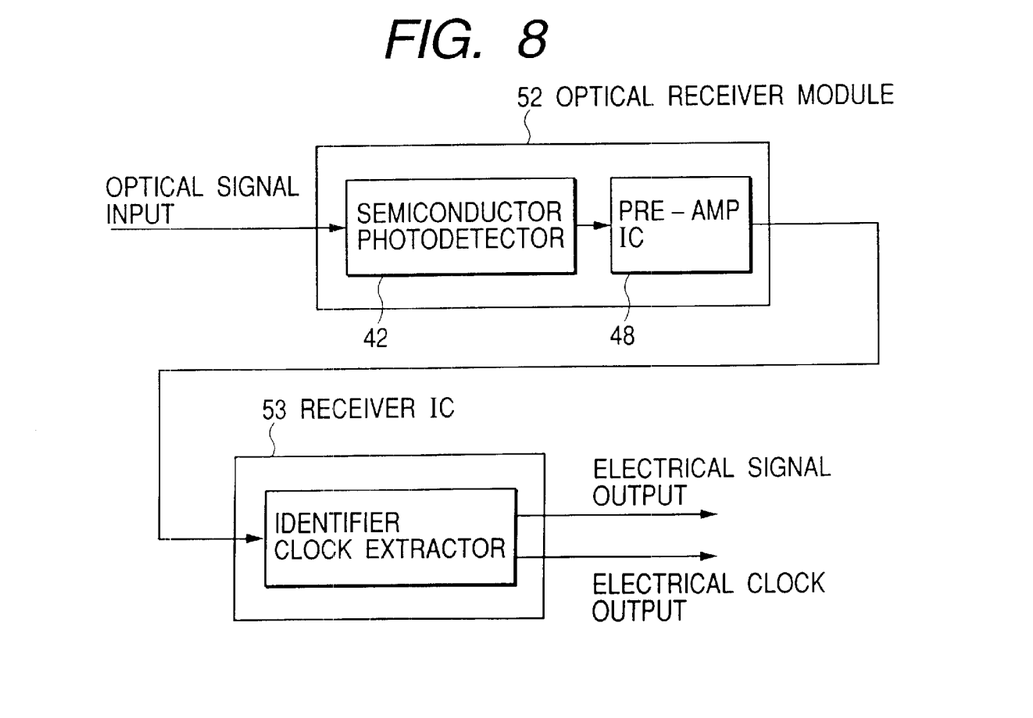
FIG. 8 is a block diagram illustrating the structure of an optical communications device which uses a photodetector according to the present invention.

FIG. 8 is a block diagram showing the structure of an optical communications device based on a photodetector according to the present invention.

An optical receiver module 52 preferably comprises two chips: a backside illuminated type photodetector 42 and a preamplifier IC 48. Here, a voltage signal is obtained through the process mentioned in the explanation of the fifth exemplary embodiment. The signal is then divided into a digital electric data signal and a clock signal by a receiver IC 53; which consists of an identifier and a clock extractor, before being output as such signals (data and clock signals).

An evaluation of the communications properties of an experimental module revealed that the sensitivity at an error rate of $10^{-12}$ is −27 dBm when the signal light wavelength optical is 1.5 μm and the signal speed 10 Gb/s.

Instead of the optical receiver module, an optical transmitter module and an optical transmitter/receiver module which integrate a backside illuminated type photodetector according to the present invention may be used. Although the above-mentioned embodiments assume that a mesa structure semiconductor photodetector and an optical module and a transmission device which incorporate the same are used, the electrode structure according to the present invention may also be applied to a planar type semiconductor photodetector.

When a backside illuminated type photodetector according to an embodiment of the present invention is used, an ultrahigh speed, high sensitivity optical transmission device may be produced because there is no rise in the resistance and a high quantum efficiency is achievable.

While several embodiments of the invention have been illustrated and described in detail, it is to be clearly understood that the invention is not limited thereto or thereby. Although the use of a mesa structure backside illuminated type photodetector is assumed in the descriptions of the embodiments, the electrode structure according to the present invention may be applied to a planar type photodetector. Likewise, although the embodiments assume the use of a single SiN insulating film layer, it is also possible to use a $SiO_2$ film, a SiON film, a polyimide film, a SOG film or a laminate composed of these films, or a single insulating film which transmits light such as a metal oxide film or a metal nitride film, or a laminate composed of these films. Also, a conductive film such as a metal oxide film or a metal nitride film may be used on the contact layer.

As can be understood from the present description, when a surface illuminated type photodetector according to the present invention is used, it is possible to make, with high reproducibility, an ultrahigh speed, high sensitivity optical module, a semiconductor photo receiver an optical transmission device, and/or other devices which cope with increased transmission capacities because there is no rise in photodetector resistance and a high quantum efficiency is achievable.

The foregoing invention has been described in terms of preferred embodiments. However, those skilled, in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor photodetector, comprising:
    a substrate having a first surface on or over which semiconductor layers are formed and a second surface via which an incident light enters;
    a photo absorbing layer formed on or over said semiconductor layers;
    a semiconductor layer formed on or over said photo absorbing layer;
    a laminate reflector including a transparent film and a metal film, said transparent film being formed between said metal film and said semiconductor layer and made with spaces shaped in strips therein; and
    a plurality of narrow-stripe ohmic contact areas formed between said semiconductor layer and said metal film and defined by said spaces in said transparent film,
    wherein said incident light passes through said second surface, said first surface, said semiconductor layers, and said photo absorbing layer in order so as to be absorbed by said photo absorbing layer, a light passing via said photo absorbing layer passes said semiconductor layer to reach and be reflected by said metal film, and a size of each of said ohmic contact areas is determined to prevent said ohmic contact areas from focusing a reflected incident light.

2. A semiconductor photodetector according to claim 1, wherein the width of each of said plurality of narrow-stripe ohmic contact areas is no more than 2 μm.

3. A semiconductor photodetector according to claim 1, wherein said transparent film is a single layer dielectric film.

4. A semiconductor photodetector according to claim 1, wherein said transparent film is a multilayered laminate dielectric film comprised of a plurality of different types of films.

5. A semiconductor photodetector according to claim 1, wherein said transparent film is electrically conductive.

6. A semiconductor photodetector according to claim 2, wherein said plurality of narrow-stripe ohmic contact areas are in concentric circles.

7. A semiconductor device, comprising:
    a semiconductor photodetector comprised of:
        a photodetector substrate having a first surface on or over which semiconductor layers are formed and a second surface via which an incident light enters;
        a photo absorbing layer formed on or over said semiconductor layers;
        a semiconductor layer formed on or over said photo absorbing layer;
        a laminate reflector including a transparent film and a metal film, said transparent film being formed between said metal film and said semiconductor layer and made with spaces shaped in strips therein; and
        a plurality of narrow-stripe ohmic contact areas formed between said semiconductor layer and said metal film and defined by said spaces in said transparent film,
        wherein said incident light passes through said second surface, said first surface, said semiconductor layers, and said photo absorbing layer in order so as to be absorbed by said photo absorbing layer, a light passing via said photo absorbing layer passes said semiconductor layer to reach and be reflected by said metal film, and a size of each of said ohmic contact areas is determined to prevent said ohmic contact areas from focusing a reflected incident light; and
    a device substrate, wherein said semiconductor photodetector is mounted onto said device substrate.

8. A semiconductor device according to claim 7, wherein said photodetector mounted on said device substrate forms a photo receiver.

9. A semiconductor device according to claim 8, wherein the width of each of said plurality of narrow-stripe ohmic contact areas is no more than 2 μm.

10. A semiconductor device according to claim 7, further comprising: an optical fiber mounted on said device substrate, wherein said optical fiber is oriented to allow an outgoing light thereof to impinge on the semiconductor photodetector as said incident light.

11. A semiconductor device according to claim 7, further comprising: a semiconductor laser mounted on said device substrate, wherein said semiconductor laser is oriented to allow an outgoing light thereof to impinge on the semiconductor photodetector as said incident light.

12. A semiconductor device according to claim 11, wherein the width of each of said plurality of narrow-stripe ohmic contact areas is no more than 2 μm.

13. A semiconductor device according to claim 7, further comprising: an optical fiber mounted on said device substrate, wherein said optical fiber is oriented to allow an outgoing light thereof to impinge on the semiconductor photodetector as said incident light; and a semiconductor laser mounted on said device substrate, wherein said laser is oriented to direct a light into said optical fiber.

14. A semiconductor device according to claim 13, wherein the width of each of said plurality of narrow-stripe ohmic contact areas is no more than 2 μm.

15. A semiconductor device according to claim 11, further comprising:
    an optical module package made from a material selected from the group consisting of ceramic, resin, plastic, metal and a subcombination thereof.

16. A semiconductor device according to claim 15, wherein the width of each of said plurality of narrow-stripe ohmic contact areas is no more than 2 μm.

17. A semiconductor device according to claim 16, further comprising:
    an electronic circuit on the device substrate electrically connected with the semiconductor photodetector.

18. A semiconductor device according to claim 15, further comprising:
    an electronic circuit mounted on a printed circuit board, wherein said electronic circuit is electrically connected to said semiconductor photodetector to form an optical communications device.

19. A semiconductor device according to claim 18, wherein said electronic circuit is comprised of:
    a pre-amplifier; and
    a clock-extracting circuit.

20. A semiconductor device according to claim 18, wherein the width of each of said plurality of narrow-stripe ohmic contact areas is no more than 2 μm.

* * * * *